United States Patent [19]
Hashimoto

[11] Patent Number: 4,775,958
[45] Date of Patent: Oct. 4, 1988

[54] SEMICONDUCTOR MEMORY SYSTEM

[75] Inventor: Kiyokazu Hashimoto, Tokyo, Japan

[73] Assignee: NEC Corporation, Tokyo, Japan

[21] Appl. No.: 878,918

[22] Filed: Jun. 26, 1986

[30] Foreign Application Priority Data

Jun. 26, 1985 [JP] Japan .................. 60-139563

[51] Int. Cl.$^4$ .................................. G11C 11/40
[52] U.S. Cl. .................... 365/185; 365/189
[58] Field of Search ...... 365/185, 104, 184, 189, 230, 365/218

[56] References Cited

U.S. PATENT DOCUMENTS

| | | | |
|---|---|---|---|
| 4,342,099 | 7/1982 | Kuo ................. | 365/184 |
| 4,527,257 | 7/1985 | Cricchi ............. | 365/184 |
| 4,586,163 | 4/1986 | Koike ............... | 365/184 |

Primary Examiner—Terrell W. Fears
Attorney, Agent, or Firm—Sughrue, Mion, Zinn, Macpeak & Seas

[57] ABSTRACT

A semiconductor memory system of, typically, the EEPROM type comprising a memory cell including a memory transistor which is typically a SAMOS type non-volatile device having a first threshold voltage higher than a predetermined reference level when the memory transistor is in a state storing a logic "0" bit of data and a second threshold voltage lower than the reference level when the memory transistor is in a state storing the other of the logic "1" bit of data. A control circuit for controlling the control gate of the SAMOS type memory transistor, comprising a combination of transistors arranged to be operative to produce a readout voltage intervening between the reference level and the first threshold voltage, the memory transistor being responsive to the readout voltage for having a first state if the memory transistor has the first threshold voltage and a second state if the memory transistor has the second threshold voltage. A sense amplifier is responsive to each of the first state and the second state of the memory transistor for reading the logic "1" bit of data or the logic "0" bit of data stored therein.

13 Claims, 6 Drawing Sheets

SEMICONDUCTOR MEMORY SYSTEM

FIELD OF THE INVENTION

The present invention relates in general to semiconductor memory systems and, in particular, to an electrically erasable and programmable read-only memory (EEPROM) system. More particularly, the present invention relates to a semiconductor memory system of the EEPROM type using a floating-gate type insulated-gate (IG) field-effect transistor (FET) as a memory element in each of the memory cells.

The IG FET device herein used is typically of the type having a control gate in addition to the floating gate and is operative for read, write and erase modes of operation under the control of a gate control circuit which is adapted to control the voltage to be applied to the control gate of the IG FET device. As well known in the art, a floating-gate IG FET thus having a control gate is useful as a non-volatile semiconductor memory element typically in an EEPROM type memory system.

GENERAL BACKGROUND OF THE INVENTION

In an EEPROM type memory system using non-volatile memory transistor devices, the memory transistor of a memory cell into which a logic "1" data has been written has a certain first level of threshold voltage. When the bit of data thus written into the memory cell is erased electrically so that a logic "0" data is "written" into the memory cell including the particular transistor, the threshold voltage of the memory transistor shifts to a second threshold voltage which is typically higher than the first threshold voltage. During read mode of operation, a certain readout voltage lower than the first threshold voltage and higher than the second threshold voltage is applied to the control gate of the memory transistor thus storing a logic "1" or "0" data from a gate control circuit predominant over all of the memory cells forming the memory array. In response to the readout voltage, the transistor becomes conductive if the content of the memory cell including the particular transistor is of logic "1" value or non-conductive if the content of the memory cell is of logic "0" value. The conductive or non-conductive state of the memory transistor is detected by an associated sense amplifier so that either a logic "1" bit of data or a logic "0" bit of data is output to an input/output interface as is customary.

In a known EEPROM type memory system of this nature, the readout voltage to be supplied from the gate control circuit is typically selected at ground level with the aforesaid first and second threshold voltages selected to be equal in magnitude to each other with respect to the ground level. As will be discussed in more detail, the use of a voltage of the ground level as the readout voltage however results in reduction in the current to flow through the memory transistor storing a logic "1" data when the transistor is selected during the read mode of operation. The small current through the transistor is ordinarily insufficient for enabling the associated sense amplifier to respond fast and properly to the conductive, logic "1" state of the transistor. The operation time required for a sense amplifier shares considerably in the total operation time of an EEPROM system as well known in the art and, for this reason, it is important to enable the sense amplifier to operate faster for achieving a higher speed of operation of the system as a whole. Thus, a prior-art gate control circuit of the described nature has a drawback in that the control circuit is not compatible in performance with an EEPROM system which is essentially required to operate at high speeds.

Another problem encountered in an EEPROM system is the degradation of the performance quality of the memory transistors as caused by the repeated write-erase cycles which the transistors will experience during use of the system. As will be discussed in detail, a prior-art gate control circuit of the described nature further has a drawback in that the circuit has not such a margin that is broad enough to compensate for such degradation of the performance quality of the memory transistors.

It is, accordingly, an important object of the present invention to provide an improved EEPROM memory system using non-volatile memory devices and featuring a gate control circuit adapted to produce an increased current through a memory transistor storing a logic "1" bit of data when the particular memory transistor is selected during read mode of operation.

It is another important object of the present invention to provide an improved EEPROM memory system using non-volatile memory devices and incorporating a gate control circuit which is relatively simple in construction and which provides a margin broad enough to compensate for the degradation of the performance quality of the memory transistors as caused when the transistors have repeated a number of write-erase cycles.

SUMMARY OF THE INVENTION

In accordance with the present invention, there is provided a semiconductor memory system comprising (a) a memory cell including a memory transistor which has a first threshold voltage higher than a predetermined reference level when the memory transistor is in a state storing one of a logic "1" bit of data and a logic "0" bit of data and a second threshold voltage lower than the reference level when the memory transistor is in a state storing the other of the logic "1" bit of data and the logic "0" bit of data;

(b) a control circuit comprising readout voltage generating means operative to produce a readout voltage intervening between the reference level and the first threshold voltage, the memory transistor being responsive to the readout voltage for having a first state if the memory transistor has the first threshold voltage and a second state if the memory transistor has the second threshold voltage, and (c) readout means responsive to each of the first state and the second state of the memory transistor for reading the logic "1" bit of data or the logic "0" bit of data stored therein.

In a preferred embodiment of a semiconductor memory system thus arranged, the control circuit further comprises write voltage generating means operative to produce a write voltage of a predetermined level for producing one of the aforesaid first and second states in the memory transistor to store the logic "1" bit of data into the transistor, and erase voltage generating means operative to produce an erase voltage of another predetermined level for producing the other of the aforesaid first and second state in the memory transistor to store the logic "0" bit of data into the transistor.

The memory transistor used in a semiconductor memory system is preferably of the non-volatile type, in which instance the gate control circuit has a circuit output terminal and is associated with a first voltage supply terminal for a constant supply voltage, a second voltage supply terminal for a predetermined write-erase voltage higher than the supply voltage, and control signal generating means operative to produce write, erase and readout control signals each having two logic states. The erase voltage generating means and the write voltage generating means comprises first and second transistors, respectively, and the readout voltage generating means comprises third, fourth and fifth transistors, each of the first, second, third and fourth transistors having a control terminal and current input and output terminals. In this instance, the first transistor has its input terminal connected to the second voltage supply terminal, its control terminal arranged to be responsive to the erase control signal and its output terminal connected to the circuit output terminal, the first transistor being conductive in response to the erase control signal of one of the aforesaid logic states. The second transistor has its input terminal connected to the circuit output terminal and its control terminal arranged to be responsive to the write control signal, the second transistor being conductive in response to the write control signal of one of the aforesaid logic states. The third transistor has its input terminal connected to the first voltage supply terminal, its control terminal arranged to be responsive to the readout control signal and its output terminal connected to the circuit output terminal, the third transistor being conductive in response to the readout control signal of one of the aforesaid logic states. Furthermore, the fourth transistor has its control terminal arranged to be responsive to the readout control signal, the fourth transistor being conductive in response to the readout control signal of one of the aforesaid logic states. The fifth transistor has its control terminal and input terminal coupled together. One of the fourth and fifth transistors has its input terminal connected to the circuit output terminal and its output terminal connected to the control terminal and input terminal of the other of the fourth and fifth transistors, the other of the fourth and fifth transistors being grounded.

BRIEF DESCRIPTION OF THE DRAWINGS

The drawbacks of a prior-art EEPROM type semiconductor memory system and the features and advantages of a semiconductor memory system according to the present invention will be more clearly understood from the following description taken in conjunction with the accompanying drawings in which.

DETAILED DESCRIPTION OF THE PRIOR ART

Figure 1:
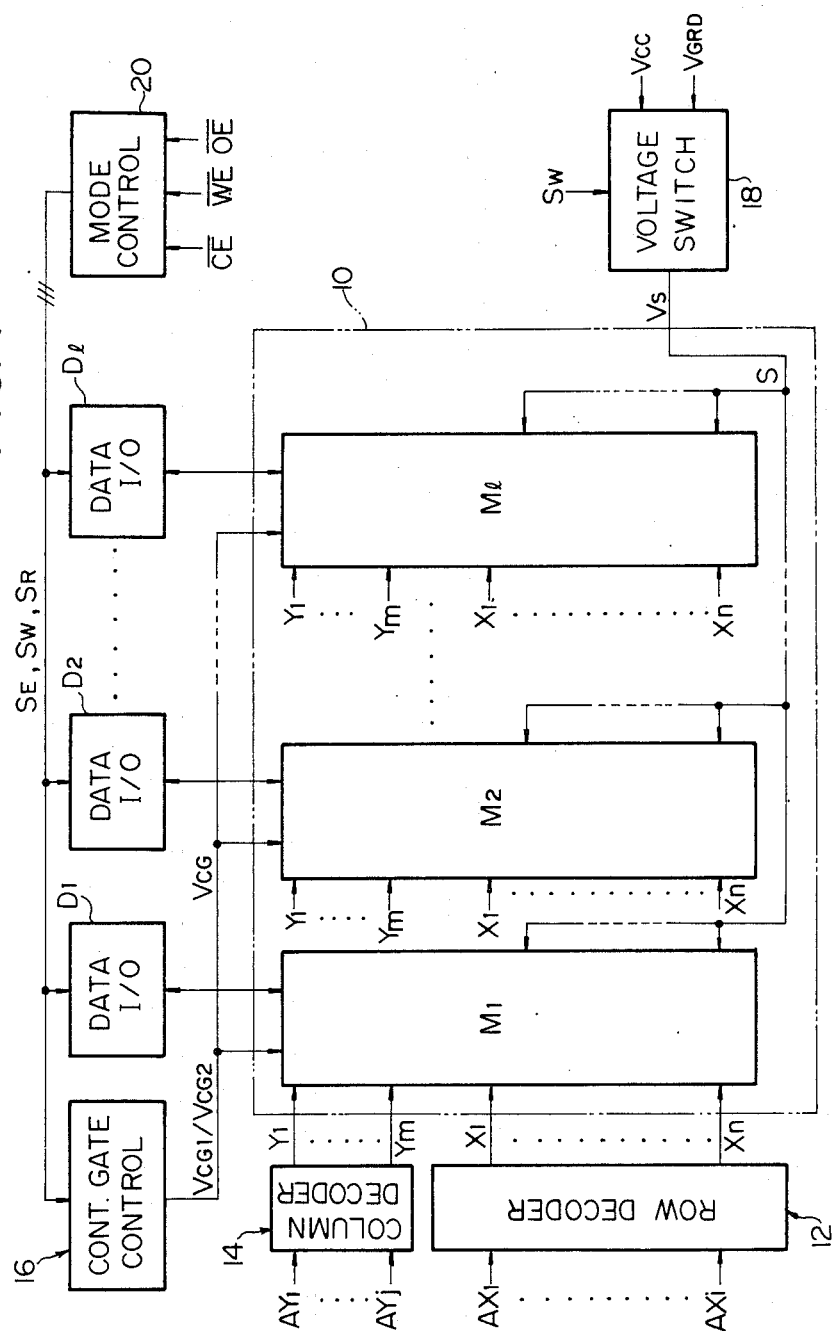
FIG. 1 is a schematic block diagram showing the overall arrangement of a semiconductor memory system of the type to which the present invention generally appertains.

FIG. 1 of the drawings schematically shows the general arrangement of an EEPROM type semiconductor memory system of the type to which the present invention appertains. As shown, the EEPROM system comprises a memory array 10 which includes a plurality of memory array blocks $M_1, M_2, \ldots$ and $M_l$ each composed of a number of memory cells which are arranged in rows and columns. The individual memory cells of each of these memory array blocks $M_1, M_2, \ldots$ and $M_l$ are to be accessed by row select signals $X_1$ to $X_n$ supplied from a row address decoder 12 and column select signals $Y_1$ to $Y_m$ supplied from a column address decoder 14. The row address decoder 12 is operative to activate the row select signals $X_1$ to $X_n$ in response to row address signals $AX_1$ to $AX_I$ and, likewise, the column address decoder 14 is operative to activate the column select signals $Y_1$ to $Y_m$ in response to column address signals $AY_1$ to $AY_J$. Data are to be selectively written into and read from the individual memory cells of the memory array blocks $M_1, M_2, \ldots M_l$ by means of data input/output buffer units $D_1, D_2, \ldots$ and $D_l$, which are associated with the array blocks $M_1, M_2, \ldots$ and $M_l$, respectively. Each of the memory cells of the memory array blocks $M_1, M_2, \ldots$ and $M_l$ includes a memory transistor of the SAMOS type having a control gate to be activated by a control gate voltage $V_{CGI}$ supplied from a gate control circuit 16. Furthermore, each of the memory cells of the memory array blocks $M_1, M_2, \ldots$ and $M_l$ is to receive a source voltage $V_S$ from a source voltage switch circuit 18 also during erase, write and read modes of operation of the memory system. As will be seen as the description proceeds, the source voltage switch circuit 18 is operative to produce as the source voltage $V_S$ either a constant supply voltage $V_{CC}$ during a write mode of operation or a voltage of ground level $V_{GRD}$ during an erase mode of operation or a read mode of operation. The gate control circuit 16, source voltage switch circuit 18 and each of the input/output buffer units is controlled for any of write, erase and read modes of operation by means of a mode control signal generator 20 which is operative to produce mode control signals $S_E$, $S_W$ and $S_R$ each of a logic low or high level, as will be described in more detail.

Figure 2:
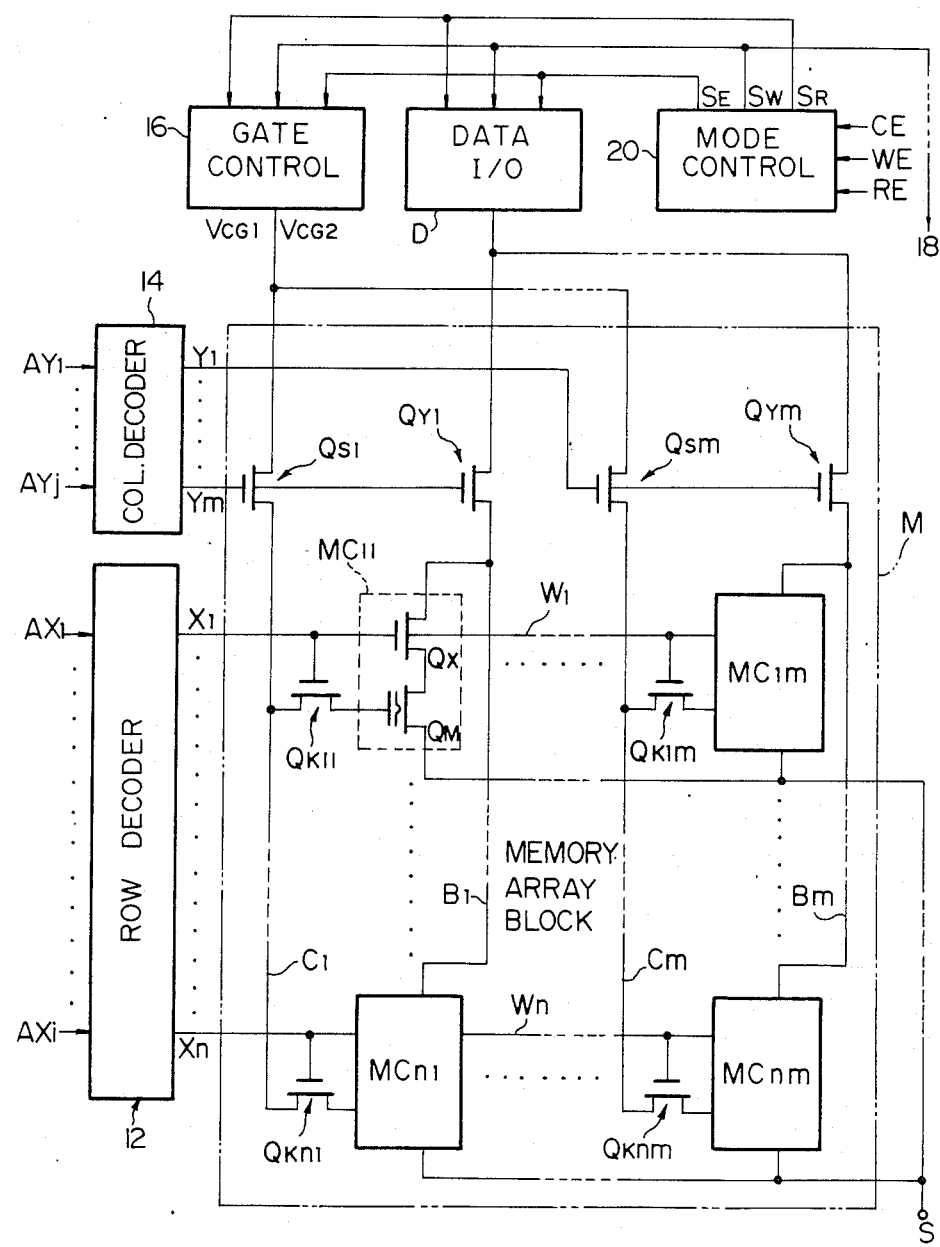
FIG. 2 is a schematic block diagram showing the somewhat detailed construction and arrangement of one of the memory array blocks forming the memory array in the system illustrated in FIG. 1.

FIG. 2 of the drawings shows a memory block M which represents each of the individual memory array blocks $M_1$, $M_2$, ... and $M_1$ of the memory array 10 illustrated in FIG. 1. In FIG. 2, furthermore, the data input/output buffer unit $D_1$, $D_2$, ... and $D_1$ respectively associated with the memory array blocks $M_1$, $M_2$, ... and $M_1$ is represented by a data input/output buffer unit D.

The memory array block M shown in FIG. 2 comprises a number of memory cells which consist of memory cells $MC_{11}$ ... $MC_{n1}$ to memory cells $MC_{1m}$ ... $MC_{nm}$ which are arranged in an n number of rows and an m number of columns formed by row or word lines $W_1$ to $W_n$ and column or bit lines $B_1$ to $B_m$. The word lines $W_1$ to $W_n$ are connected to the row address decoder 12, and the bit lines $B_1$ to $B_m$ are connected to the column address decoder 14 respectively through the gates of control gate select transistors $Q_{S1}$ to $Q_{Sm}$ and gates of column address select transistors $Q_{Y1}$ to $Q_{Ym}$. Each of the control gate select transistors $Q_{S1}$ to $Q_{Sm}$ and column address select transistors $Q_{Y1}$ to $Q_{Ym}$ is connstituted by an enhancement-type n-channel IG FET. As illustrated for the memory cell $MC_{11}$ in particular, each of the memory cells $MC_{11}$ ... $MC_{n1}$ to $MC_{1m}$ ... $MC_{nm}$ in the memory array block M consists of a series combination of an row address select cell transistor $Q_X$ and a memory transistor $Q_M$. The row address select cell transistor $Q_X$ is constituted by an enhancement-type n-channel IG FET, while the memory transistor $Q_M$ is constituted by a transistor having a control gate on a gate oxide layer in addition to a floating gate buried in the gate oxide layer. The respective row address select transistors of the memory cells $MC_{11}$ ... $MC_{n1}$ to $MC_{1m}$ ... $MC_{nm}$ have their gates connected to the row address decoder 12 via the associated word lines $W_1$ to $W_n$ and their drains connected to the data input/output buffer unit D through the sources and drains of the column address select transistors $Q_{Y1}$ to $Q_{Ym}$, respectively. The column address select transistors $Q_{Y1}$ to $Q_{Ym}$ have their respective gates connected to the column address decoder 14 via the gates of the control gate select transistors $Q_{S1}$ to $Q_{Sm}$ on the bit lines $B_1$ to $B_m$, respectively. On the other hand, the respective memory transistors $Q_M$ of the memory cells $MC_{11}$ ... $MC_{n1}$ to $MC_{1m}$ ... $MC_{nm}$ have their gates connected to gate control lines $C_1$ to $C_n$ through the sources and drains of kks $Q_{K11}$ ... $Q_{Kn1}$ to $Q_{K1m}$ ... $Q_{Knm}$, respectively. In each of the memory cells $MC_{11}$ ... $MC_{n1}$ to $MC_{1m}$ ... $MC_{nm}$, the drain (Dr) of the memory transistor $Q_M$ and the source of the row address select cell transistor $Q_X$ are coupled together.

The cell row address select tramnsistors $Q_{K11}$ ... $Q_{Kn1}$ to $Q_{K1m}$ ... $Q_{Knm}$ respectively associated with the memory cells $MC_{11}$ ... $MC_{n1}$ to $MC_{1m}$ ... $MC_{nm}$ have their gates connected to the row address decoder 12 via the associated word lines $W_1$ to $W_n$, respectively. Accordingly, each of the word lines $W_1$ to $W_n$ leading from the row address decoder 12 is connected to the gates of the individual row address select transistors of the memory cells $MC_{11}$ to $MC_{n1}$, ..., or $MC_{1m}$ to $MC_{nm}$ on the particular word line and to the gates of the kks $Q_{K11}$ to $Q_{Kn1}$, ..., or $Q_{K1m}$ to $Q_{Knm}$ associated with the memory cells $MC_{11}$ to $MC_{n1}$, ..., or $MC_{1m}$ to $MC_{nm}$. Each of the kks $Q_{K11}$ ... $Q_{Kn1}$ to $Q_{K1m}$ ... $Q_{Knm}$ thus arranged is also constituted by an enhancement-type n-channel IG FET. The gate control lines $C_1$ to $C_m$ are connected through the sources and drains of the control gate select transistors $Q_{S1}$ to $Q_{Sm}$ jointly to the gate control circuit 16. On the other hand, the memory transistors $Q_M$ of the individual memory cells $MC_{11}$ ... $MC_{n1}$ to $MC_{1m}$ ... $MC_{nm}$ have their sources jointly connected to a node S leading from the output terminal of the source voltage switch circuit 18 (FIG. 1).

In FIG. 2, furthermore, the control signal generator 20 is responsive to input signals including a chip-enable signal $\overline{CE}$, a write-enable signals $\overline{WE}$ and an output-enable signal $\overline{OE}$. During write mode of operation, the control signal generator 20 receives a logic low signal in repsonse to the chip-enable signal $\overline{CE}$, a logic low signal in response to the write-enable signal $\overline{WE}$ and a logic high signal in response to the ouput-enable signal $\overline{OE}$ and produces an output signal $S_E$ of logic low level, an output signal $S_W$ of logic high level and an output signal $S_R$ of logic low level. During erase mode of operation, the control signal generator 20 receives a logic low signal in response to each of the chip-enable, write-enable and output-enable signals $\overline{CE}$, $\overline{WE}$ and $\overline{OE}$ and produces an output signal $S_E$ of logic high level, an output signal $S_W$ of logic low level and an output signal $S_R$ of logic low level. During read mode of operation, the control signal generator 20 receives a logic low signal in response to the chip-enable signal $\overline{CE}$, a logic high signal in response to the write-enable signal $\overline{WE}$ and a logic low signal in response to the output-enable signal $\overline{OE}$ and produces an output signal $S_E$ of logic low level, an output signal $S_W$ of logic low level and an output signal $S_R$ of logic high level. Thus, the control signal generator 20 is operative to produce output signals $S_E$, $S_W$ and $S_R$ of logic low and high levels L and H in response to the chip-enable, write-enable and output-enable signals $\overline{CE}$, $\overline{WE}$ and $\overline{OE}$ in accordance with the schedules indicated by Table 1.

TABLE 1

| Mode of Operation | Input Signal | | | Output Signal | | | Control-Gate Voltage |
|---|---|---|---|---|---|---|---|
| | $\overline{CE}$ | $\overline{WE}$ | $\overline{OE}$ | $S_E$ | $S_W$ | $S_R$ | ($V_{CG1}$) |
| Write | L | L | H | L | H | L | $V_{GRD}$ |
| Erase | L | L | L | H | L | L | V-V PP T |
| Read | L | H | L | L | L | H | $V_R$ |

The signals $S_E$, $S_W$ and $S_R$ thus supplied from the control signal generator 20 during each of write, erase and read modes of operation are supplied to the gate control circuit 16 and enable the control circuit 16 to produce as the previously mentioned control gate voltage $V_{CG1}$, an output signal of a ground level ($V_{GRD}$) during write mode of operation, one certain level (viz., erase voltage $V_{PP}-V_T$ as will be discussed) during erase mode of operation, or another certain level (viz., readout voltage $V_{R1}$ as will also be discussed) during read mode of operation of the memory system as also indicated in Table 1. The output signals $S_E$, $S_W$ and $S_R$ from the control signal generator 20 are supplied not only to the gate control circuit 16 but also to the input-output buffer unit D and activate or inactivate the data input and output buffer circuits in the unit D depending upon the mode of operation to be selected of the memory system. The signal $S_W$ in particular is further supplied to the source voltage switch circuit 18 (FIG. 1) and causes the switch circuit 18 to output either the supply voltage $V_{CC}$ or a voltage of ground level $V_{GRD}$ as the voltage $V_S$ to be supplied to the source of the memory transistor $Q_M$ of each of the memory cells in each of the memory array blocks $M_1$, $M_2$, ... and $M_1$ of the memory array 10 shown in FIG. 1.

In the memory array block M arranged with a total of n×m number of memory cells, any one of the memory cells $MC_{11} \ldots MC_{n1}$ to $MC_{1m} \ldots MC_{nm}$ is selected during each of write, erase and read modes of operation of the memory system by one of the row select signals $X_1$ to $X_n$ and one of the column select signals $Y_1$ to $Y_m$. In the description to follow, it will be assumed by way of example that, among the memory cells in the memory array block M, viz., in each of the memory array blocks $M_1, M_2, \ldots$ and $M_l$ of the memory array 10 shown in FIG. 1, the memory cell $MC_{11}$ in particular is selected with the row and column select signals $X_1$ and $Y_1$ activated in the row and column address decoders 12 and 14, respectively.

Figure 3:
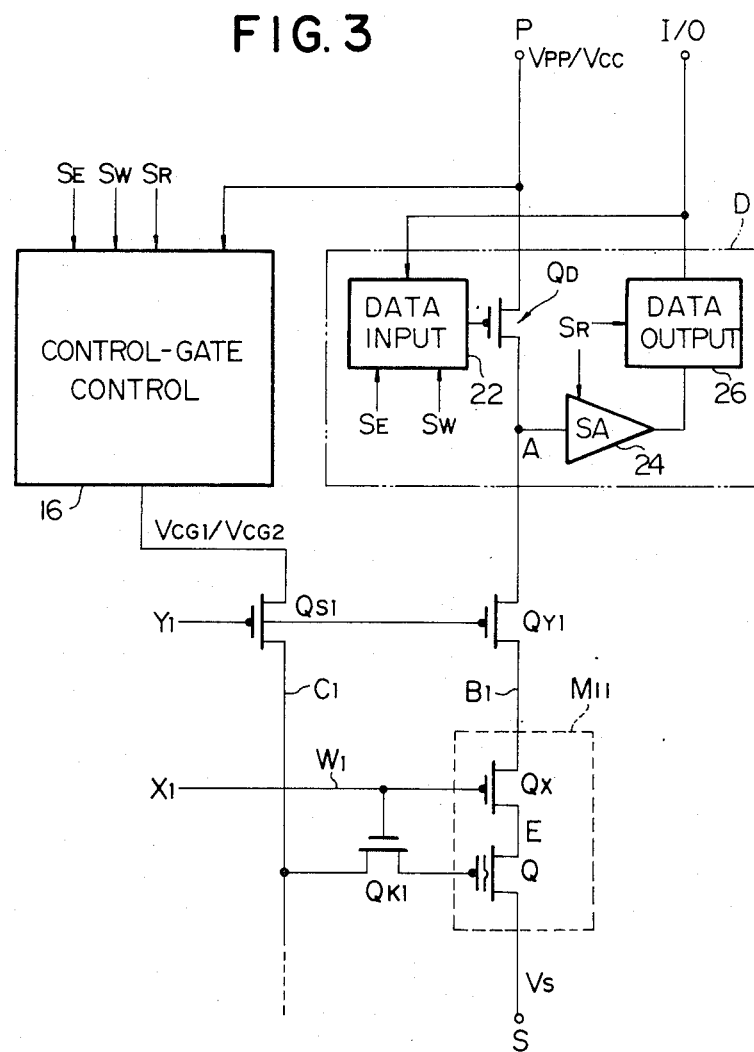
FIG. 3 is a circuit diagram view showing the circuit arrangement of one of the memory cells of the memory array block shown in FIG. 2 in addition to the detailed construction of the data input/output buffer unit which has been only schematically shown in FIGS. 1 and 2.

In FIG. 3 of the drawings are shown only the particular memory cell $MC_{11}$ and the associated control gate select cell transistor $Q_{S1}$ and column address select transistor $Q_{S1}$ in addition to the detailed construction of the input/output buffer unit D. The data input/output buffer arrangement D is shown comprising a data input buffer circuit 22 which is to be activated during write mode of operation or erase mode of operation. The data input buffer circuit 22 has an input terminal connected to an input/output interface terminal "I/O" and an output terminal connected to the gate of an input control transistor $Q_D$ which is to receive a gate voltage $V_D$ of either the ground level $V_{GRD}$ or of a predetermined level $V_{PP}$ higher than the supply voltage $V_{CC}$ from the buffer circuit 22. The input control transistor $Q_D$ has its drain connected to a voltage supply terminal "P" and its source connected to the individual bit lines $B_1$ to $B_m$ through the column address select transistors $Q_{Y1}$ to $Q_{Ym}$. At the voltage supply terminal "P" are to be selectively established a write-erase voltage $V_{PP}$ during write and erase modes of operation and a supply voltage $V_{CC}$ during read mode of operation. The input control transistor $Q_D$ is also constituted by an enhancement-type n-channel IG FET. The data input/output buffer unit D further comprises a sense amplifier 24 having an input terminal connected to a node "A" between the source of the input control transistor $Q_D$ and the drain of each of the column address select transistors $Q_{Y1}$ to $Q_{Ym}$ and an output terminal connected to a data output buffer circuit 26. The data output buffer circuit 26 is to be activated during read mode of operation and has an output terminal connected to the input/output interface terminal "I/O". The input control transistor $Q_D$ is to be made non-conductive to isolate the sense amplifier 24 from the voltage supply terminal "P" during read mode of operation, as will be discussed in more detail.

Description will be hereinafter made with concurrent reference to FIGS. 1 to 3 in regard to the modes of operation of the semiconductor memory system thus constructed and arranged. As noted previously, it will be assumed that, among the memory cells $MC_{11} \ldots MC_{n1}$ to $MC_{1m} \ldots MC_{nm}$ in each of the memory array blocks $M_1, M_2, \ldots$ and $M_l$ of the memory array 10 illustrated in FIG. 1, the memory cell $MC_{11}$ in particular is selected with the row and column select signals $X_1$ and $Y_1$ activated in the row and column address decoders 12 and 14, respectively. For purposes of description, furthermore, it will be also assumed that each of the enhancement-type n-channel transistors $Q_X, Q_{K1}, Q_{S1}, Q_{Y1}$ and $Q_D$ shown in FIG. 3 commonly has a predetermined threshold voltage $V_T$ and that a voltage $V_{PP}$ is used both as a write voltage and an erase voltage. It will be further assumed that the carriers to be emitted out of and injected into the floating gate of the memory transistor $Q_M$ so as to respectively write a logic "1" bit of data and a logic "0" bit of data into the memory cell $M_{11}$ are electrons. The threshold voltage $V_T$ of the transistors $Q_X, Q_{K1}, Q_{S1}, Q_{Y1}$ and $Q_D$ may be of a value typical of a standard enhancement-type n-channel transistor.

The row select signal $X_1$ being activated in the row address decoder 12, the word line $W_1$ is selected so that a conduction state is established through each of the cell row address select transistor $Q_{K1}$ and the row address select cell transistor $Q_X$ of the memory cell $M_{11}$. With the column select signal $Y_1$ activated in the column address decoder 14, furthermore, the bit line $B_1$ is selected so that a conduction state is established through each of the control gate select cell transistor $Q_{S1}$ and column address select transistor $Q_{Y1}$. The memory cell $M_{11}$ at the cross point between the word line $W_1$ and bit line $B_1$ is thus selected in each of the memory array blocks $M_1, M_2, \ldots$ and $M_l$ of the memory array 10 illustrated in FIG. 1.

Table 2 indicates the schedule in accordance with which the control gate voltage $V_{CG1}$ to be produced by the gate control circuit 16, the voltage to be established on the word and bit lines, the gate voltage $V_D$ to be supplied to the gate of the input control transistor $Q_D$, and the voltage $V_S$ to be supplied to the source of the memory transistor $Q_M$ of the memory cell $M_{11}$ during write, erase and read modes of operation of the system.

TABLE 2

| Mode of Operation | Control-Gate Voltage ($V_{CG1}$) | Word Line Voltage | Bit Line Voltage | Gate Voltage ($V_D$) | Source Voltage ($V_S$) |
|---|---|---|---|---|---|
| Write | $V_{GRD}$ | $V_{PP}$ | $V_{PP}$ | $V_{PP}/V_{GRD}$ | $V_{CC}$ |
| Erase | $V_{PP}-V_T$ | $V_{PP}$ | $V_{PP}$ | $V_{GRD}$ | $V_{GRD}$ |
| Read | $V_R$ | $V_{CC}$ | $V_{CC}$ | $V_{GRD}$ | $V_{GRD}$ |

(1) Write Mode

During write or programming mode of operation, there is the write/erase voltage $V_{PP}$ established on each of the word and bit lines $W_1$ and $B_1$ as shown in Table 2. The control signal generator 20 receives an input signal of logic low level "L" in response to the chip-enable signal $\overline{CE}$, an input signal of the logic low level "L" in response to the write-enable signal $\overline{WE}$ and an input signal of logic high level "H" in response to the output-enable signal $\overline{OE}$. With such input signals $\overline{CE}$, $\overline{WE}$ and $\overline{OE}$, the control signal generator 20 produces an output signal $S_E$ of logic low level "L", an output signal $S_W$ of logic high level "H" and an output signal $S_R$ of logic low level "L" as indicated in Table 1. In response to these output signals $S_E$, $S_W$ and $S_R$, the gate control circuit 16 produces an output signal of a ground level $V_{GRD}$ as the control gate voltge $V_{CG1}$ as also shown in Table 1. The control gate voltage $V_{CG1}$ of the ground level $V_{GRD}$ is passed via the gate control line $C_1$ and through the control gate select cell transistor $Q_{S1}$ and cell row address select transistor $Q_{K1}$ to the control gate of the memory transistor $Q_M$ forming part of the selected memory cell $M_{11}$. The output signals $S_E$, $S_W$ and $S_R$ from the control signal generator 20 are also supplied to the input/output buffer unit D. In the input/output buffer unit D, the signal $S_E$ of logic low level "L" and the signal $S_W$ of logic high level "H" activate the data input buffer circuit 22 and the signal $S_R$ of logic low level "L" maintains the sense amplifier 24 and data output buffer circuit 26 inactive. The signal $S_W$ of high level "H" in particular is further supplied to the source voltage switch circuit 18 (FIG. 1) and causes the switch circuit 18 to produce the supply voltage $V_{CC}$ as the voltage $V_S$ to be supplied to the source of the memory transistor $Q_M$ of the memory cell $M_{11}$ as also indicated in Table 2.

The data input buffer circuit 22 being activated by the signals $S_E$ and $S_W$, a signal of either the write/erase voltage $V_{PP}$ or the ground level $V_{GRD}$ is supplied from the input/output interface terminal "I/O" to the gate of the input control transistor $Q_D$ as the previously mentioned gate voltage $V_D$. If it is the write/erase voltage $V_{PP}$ which is supplied to the gate of the input control transistor $Q_D$, the transistor $Q_D$ is made conductive so that the voltage $V_{PP}$ at the voltage supply terminal "P" is passed through the transistor $Q_D$ to produce a voltage $V_{PP}-V_T$ at the drain Dr of the memory transistor $Q_M$ of the memory cell $M_{11}$ under consideration. In the presence of the control gate voltage $V_{CG1}$ of the ground level $V_{GRD}$ at the control gate of the memory transistor $Q_M$, the electrons which may have been stored in the floating gate of the transistor $Q_M$ are emitted from the floating gate, with the result that the floating gate of the transistor $Q_M$ is charged with positive donor ions. The memory transistor $Q_M$ now has a threshold voltage of a value $V_{TM}(W)$ lower than the voltage $(V_{R1})$ to be used as the readout voltage for the memory transistor $Q_M$ during read mode of operation as will be discussed later. The state of the memory cell $M_{11}$ thus having the threshold voltage $V_{TM}(W)$ lower than the readout voltage $V_{R1}$ for the memory transistor $Q_M$ is herein defined as the logic "1" state of the memory cell $M_{11}$.

(2) Erase Mode

During erase mode of operation, there is also established the write/erase voltage $V_{PP}$ on each of the word and bit lines $W_1$ and $B_1$. The control signal generator 20 now receives the chip-enable, write-enable and output-enable signals $\overline{CE}$, $\overline{WE}$ and $\overline{OE}$ each of logic low level "L". In response to these logic low input signals $\overline{CE}$, $\overline{WE}$ and $\overline{OE}$, the control signal generator 20 produces an output signal $S_E$ of logic high level "H", an output signal $S_W$ of logic low level "L" and an output signal $S_R$ of logic low level "L" as indicated in Table 1. In response to these output signals $S_E$, $S_W$ and $S_R$, the gate control circuit 16 produces an output signal of the level $V_{PP}-V_T$ as the control gate voltage $V_{CG1}$ as also shown in Table 1. The control gate voltage $V_{CG1}$ of the level $V_{PP}-V_T$ is passed via the gate control line $C_1$ and through the control gate select cell transistor $Q_{S1}$ and cell row address select transistor $Q_{K1}$ to the control gate of the memory transistor $Q_M$ of the selected memory cell $M_{11}$. The output signals $S_E$, $S_W$ and $S_R$ from the control signal generator 20 are also supplied to the input/output buffer unit D, in which the sense amplifier 24 and data output buffer circuit 26 are maintained inactive by the signal $S_R$ of logic low level "L". In response to the signal $S_E$ which has shifted to logic high level "H", the data input buffer circuit 22 provides the voltage $V_D$ of the ground level $V_{GRD}$ at the gate of the input control transistor $Q_D$ without respect to the voltage level at the input/output interface terminal "I/O", thus establishing a non-conduction state in the transistor $Q_D$. With the signal $S_W$ shifted to logic low level "L", furthermore, the source voltage switch circuit 18 (FIG. 1) is caused to produce a voltage of the ground level $V_{GRD}$ as the voltage $V_S$ to be supplied to the source of the memory transistor $Q_M$ of the memory cell $M_{11}$.

The input control transistor $Q_D$ being held in a non-conduction state, a voltage of the ground level $V_{GRD}$ is established at the drain (Dr) of the memory transistor $Q_M$ of the memory cell $M_{11}$ under consideration. In the presence of the voltage $V_{PP}-V_T$ at the gate of the memory transistor $Q_M$, electrons are injected into the floating gate from the drain of the memory transistor $Q_M$ with the result that the memory transistor $Q_M$ of the transistor $Q_M$ is charged to the negative. The memory transistor $Q_M$ now has its threshold voltage shifted to a value $V_{TM}(E)$ which is higher than the readout voltage $V_{R1}$ to be applied to the gate of the memory transistor $Q_M$ during read mode of operation. The state of the memory cell $M_{11}$ thus having the threshold voltage $V_{TM}(E)$ high than the readout voltage $V_{R1}$ in the memory transistor $Q_M$ thereof is herein defined as the logic "0" state of the memory cell $M_{11}$.

The input control transistor $Q_D$ may be conditioned to be in a non-conductive state during write mode operation in the presence of the voltage $V_D$ of the ground level $V_{GRD}$ supplied from the input/output interface terminal "I/O" to the transistor $Q_D$. In this instance, the electrons which may have been stored in the floating gate of the transistor are allowed to remain therein in the absence of a field between the source and drain of the transistor $Q_M$, which is accordingly maintained in a logic "0" state. It may thus be noted that the terms "write" and "erase" herein referred to are used in connection with the writing and erasing of logic "1" information into a memory transistor $Q_M$.

(3) Read Mode

During read mode of operation, there is the write/erase voltage $V_{CC}$ established on each of the word and bit lines $W_1$ and $B_1$ as indicated in Table 2. The control signal generator 20 now receives the chip-enable signal $\overline{CE}$ of logic low level "L", the write-enable signal $\overline{WE}$ of logic high level "H" and an input signal the output-enable signal $\overline{OE}$ of logic low level "L". In response to such input signals $\overline{CE}$, $\overline{WE}$ and $\overline{OE}$, the control signal generator 20 produces an output signal $S_E$ of logic low level "L", an output signal $S_W$ of logic low level "L" and an output signal $S_R$ of logic high level "H" as indicated in Table 1. In response to the output signals $S_E$, $S_W$ and $S_R$, the gate control circuit 16 outputs the readout voltage $V_{R1}$ as the control gate voltage $V_{CG1}$ as also shown in Table 1. The control gate voltage $V_{CG1}$ of the level $V_{R1}$ is passed via the gate control line $C_1$ and through the control gate select cell transistor $Q_{S1}$ and cell row address select transistor $Q_{K1}$ to the control gate of the memory transistor $Q_M$ of the selected memory cell $M_{11}$. With the signal $S_E$ remaining at logic low level "L", the data input buffer circuit 22 also provides the voltage $V_D$ of the ground level $V_{GRD}$ at the gate of the input control transistor $Q_D$ and maintains the transistor $Q_D$ in the non-conduction state. The signal $S_W$ also remains at logic low level "L" and thus maintains the source voltage switch circuit 18 (FIG. 1) in a condition producing the voltage of the ground level $V_{GRD}$ as the voltage $V_S$ to be supplied to the source of the memory transistor $Q_M$ of the memory cell $M_{11}$. The result is that a conductive path is provided between the drain Dr of the memory transistor $Q_M$ and the node "A" in the input/output buffer unit D through the transistors $Q_X$ and $Q_{Y1}$. In this input/output buffer unit D, the sense amplifier 24 and data output buffer circuit 26 are activated by the signal $S_R$ which has been shifted to logic high level "H".

During read mode of operation, the memory transistor $Q_M$ of the memory cell $M_{11}$ which is herein assumed to have been selected may be either in a logic "1" and conductive state with the threshold voltage $V_{TM}(W)$ lower than the readout voltage $V_{R1}$ appearing at the control gate or in a logic "0" and non-conductive state with the threshold voltage $V_{TM}(E)$ higher than the readout voltage $V_{R1}$ appearing at the control gate. Either the voltage of the ground level $V_{GRD}$ or the supply voltage $V_{CC}$ thus appears at the drain Dr of the memory transistor $Q_M$ and is applied to the sense amplifier 24 with the memory transistor $Q_M$ in the conductive or non-conductive state, respectively, with the result that a bit of information representative of either a logic "1" or a logic "0" is supplied from the data output buffer circuit 26 to the input/output interface terminal "I/O" depending on the threshold voltage $V_{TM}(W)$ or $V_{TM}(E)$ of the memory transistor $Q_M$ of the selected memory cell $M_{11}$.

It will have been understood from the foregoing description that the memory system of the described nature depends for its read mode of operation on the threshold voltage of the memory transistor $Q_M$ of each of the memory cells. If, thus, a memory cell including a memory transistor $Q_M$ into which a logic "1" bit of data has been written is selected during read mode of operation, the particular memory cell remains in a conduction state throughout read mode of operation with the threshold voltage $V_{TM}(W)$ of the transistor $Q_M$ lower than the readout voltage $V_{R1}$ applied to the control gate of the transistor $Q_M$. If, on the other hand, a memory cell including a memory transistor $Q_M$ into which a logic "0" bit of data has been written is selected during read mode of operation, the particular memory cell remains in a non-conductive state throughout read mode of operation with the threshold voltage $V_{TM}(E)$ of the transistor $Q_M$ higher than the readout voltage $V_{R1}$ which appears at the control gate of the transistor $Q_M$. The threshold voltage of the memory transistor $Q_M$ of each of the memory cells thus shifts between the values $V_{TM}(W)$ and $V_{TM}(E)$ depending upon the presence or absence of electrons injected into the floating gate of the memory transistor $Q_M$.

Figure 4:
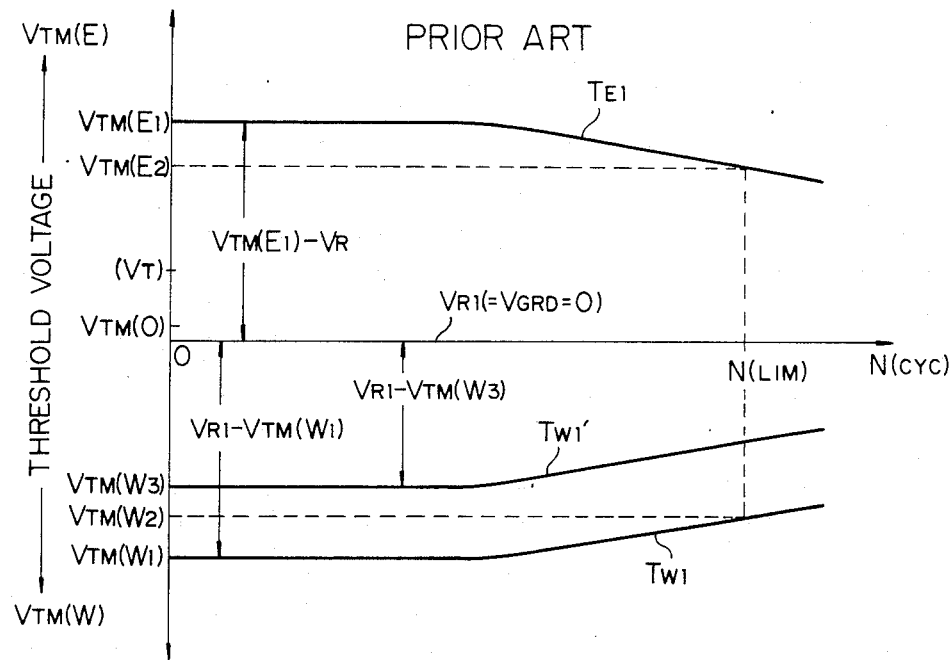
FIG. 4 is a graphic representation of the variation in the threshold voltages of a memory device which is typical of the memory transistors in a semiconductor memory system to which the present invention appertains.

Such different threshold voltages $V_{TM}(W)$ and $V_{TM}(E)$ of a SAMOS device are subject to variation with an increase in the number of times which the memory transistor $Q_M$ has repeated the write-erase cycles as well known in the art. This is accounted for by the fact that electrons tend to be trapped at the interface between the silicon substrate and gate oxide film or at the interface between the floating gate and the gate oxide film of the device as the memory transistor $Q_M$ experiences a number of write-erase cycles. FIG. 4 of the drawings is a graphic representation of such variation in the threshold voltages $V_{TM}(W)$ and $V_{TM}(E)$, as observed in the memory transistor $Q_M$ which has been under consideration. In FIG. 4, curve $T_{W1}$ shows the variation in the threshold voltage $V_{TM}(W)$ of a memory transistor $Q_M$ having a logic "1" bit of data stored therein and curve $T_{E1}$ shows the variation in the threshold voltage $V_{TM}(E)$ of a memory transistor $Q_M$ having a logic "0" bit of data stored therein, both in terms of the number N of write-erase cycles which the memory transistor $Q_M$ has repeated. The threshold voltages $V_{TM}(W)$ and $V_{TM}(E)$ are herein assumed to be respectively negative and positive with respect to a certain voltage level $V_{TM}(0)$ which intervenes between the two threshold values. Such an intermediate threshold voltage $V_{TM}(0)$ is achieved by the cell channel doping particularly for the channel region of each of the memory transistors $Q_M$ of the memory array and is the original threshold voltage of a "fresh" memory transistor $Q_M$ which remains completely intact, viz., has never been used for the writing and erasing of information. As will be seen from the curves $T_{W1}$ and $T_{E1}$, the gap between the curves, viz., the sum of the absolute values of the threshold voltages $V_{TM}(W)$ and $V_{TM}(E)$ becomes lesser as the number N of the write-erase cycles repeated. Represented by $V_{TM}(W_1)$ is the threshold voltage which the memory transistor $Q_M$ having a logic "1" bit of data stored therein will exhibit at a certain initial stage of use after fabrication of the transistor and by $V_{TM}(W_2)$ is the threshold voltage which will be exhibited by the memory transistor $Q_M$ which has repeated a predetermined or standardized limitative number $N_{(LIM)}$ of write-erase cycles. Also represented by $V_{TM}(E_1)$ is the threshold voltage at a certain initial stage of the memory transistor $Q_M$ having a logic "0" stored therein data and by $V_{TM}(E_2)$ is the threshold voltage of the memory transistor $Q_M$ which has repeated the standardized limitative number $N_{(LIM)}$ of write-erase cycles.

As has been noted, the readout voltage $V_{R1}$ used during read mode of operation of the system under consideration is lower than the threshold voltage $V_{TM}(W)$ and higher than the threshold voltage $V_{TM}(E)$. Such a readout voltage $V_{R1}$ is selected typically in a manner to meet the following three major requirements (a), (b) and (c):

(a) The readout voltage $V_{R1}$ should be such that the readout voltage will enable a memory transistor $Q_M$ of a logic "1" state to be conductive when the particular transistor is accessed and supplied with the readout voltage $V_{R1}$ at the control gate thereof during read mode of operation after the transistor has repeated the standardized limitative number $N_{(LIM)}$ of write-erase cycles. This requirement is represented by the relationship $V_{R1} > V_{TM}(W_2)$.

(b) The readout voltage $V_{R1}$ should be such that the readout voltage will enable a memory transistor $Q_M$ of a logic "0" state to remain non-conductive when the particular transistor is accessed and supplied with the readout voltage $V_{R1}$ at the control gate thereof during read mode of operation after the transistor has repeated the standardized limitative number $N_{(LIM)}$ of write-erase cycles. This requirement is represented by the relationship $V_{R1} > V_{TM}(E_2)$.

(c) The readout voltage $V_{R1}$ should be such that the readout voltage will enable the memory system (EEPROM) to access the selected memory transistor $Q_M$ in a standard minimum access time whether the selected memory transistor may be of a logic "1" state or of a logic "0" state, during read read mode of operation after the transistor has repeated the standardized limitative number $N_{(LIM)}$ of write-erase cycles.

The absolute values of the threshold voltages $V_{TM}(W_1)$ and $V_{TM}(E_1)$ with respect to the original threshold voltage $V_{TM}(0)$, viz., the value $V_{TM}(0) - V_{TM}(W_1)$ and value $V_{TM}(E_1) - V_{TM}(0)$ are determined depending on the design characteristics of a given memory transistor $Q_M$ when the write-erase voltage $V_{PP}$ is selected. Assume now that the electrons which were injected into the floating gate of the memory transistor during the last erase mode of operation are completely evacuated from the floating gate during write mode of operation. In this instance, the absolute values of the threshold voltages $V_{TM}(W_1)$ and $V_{TM}(E_1)$ with respect to the readout voltage $V_{R1}$ will become exactly equal to each other. The readout voltage $V_{R1}$ to be used as the control gate voltage $V_{CG1}$ during read mode of operation is for this reason ordinarily selected at the original threshold voltage $V_{TM}(0)$, hence $V_{R1}=V_{TM}(0)$. If, for example, the threshold voltage $V_{TM}(W_1)$ is $-4$ volts and the threshold voltage $V_{TM}(E_1)$ selected at 6 volts when the original threshold voltage $V_{TM}(0)$ is 1 volt, then the readout voltage $V_{R1}$ thus equals the original threshold voltage $V_{TM}(0)$ and is accordingly selected at 1 volt.

Figure 5:
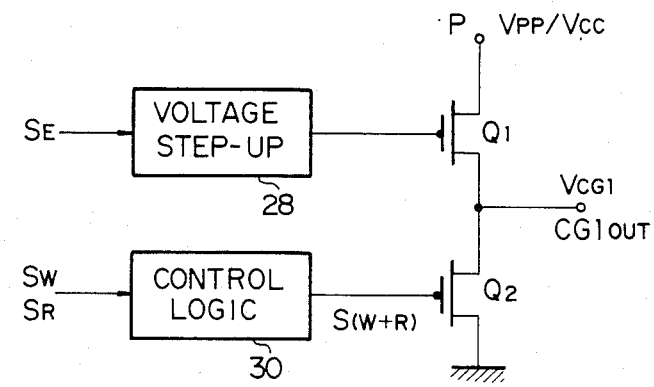
FIG. 5 is a circuit diagram showing the circuit arrangement of a known example of the gate control circuit forming part of the memory system illustrated in FIGS. 1 to 3.

FIG. 5 of the drawings shows a known example of the detailed circuit arrangement of the gate control circuit 16 incorporated in the EEPROM type semiconductor memory system of the nature which has thus far been described with reference to FIGS. 1 to 3.

As shown, the prior-art gate control circuit 16 largely consists of a series combination of first and second transistors $Q_1$ and $Q_2$ each of which is also assumed to be of the enhancement-node n-channel type. The first transistor $Q_1$ has its drain connected to the previously mentioned voltage supply terminal "P" at which are to be selectively established the write-erase voltage $V_{PP}$ during write and erase modes of operation and the supply voltage $V_{CC}$ during read mode of operation. The transistor $Q_1$ has its gate connected to a voltage step-up circuit 28 having an input terminal connected to be responsive to the control signal $S_E$ of logic high level "H" to be output from the mode control signal generator 20 (FIG. 3) during erase mode of operation. In response to the signal $S_E$ of logic high level "H", the voltage step-up circuit 28 produces a certain relatively high voltage at the gate of the transistor $Q_1$. This high output voltage from the voltage step-up circuit 28 is herein assumed to be equal to the write-erase voltage $V_{PP}$ for convenience sake. During write or read mode of operation, there is a signal of logic low level "L" established at the gate of the transistor $Q_1$ as will be seen from Table 1. On the other hand, the second transistor $Q_2$ has its source connected to ground line and its gate connected to a suitable logic circuit 30 arranged to be responsive to the control signals $S_W$ and $S_R$ to be output from the mode control signal generator 20 (FIG. 3). The logic circuit 30 may consist of an exclusive-OR logic and is operative to produce a signal $S_{(R+W)}$ of a logic high level "H" at the gate of the transistor $Q_2$ in response to the control signals $S_W$ and $S_R$ of logic high and low levels H and L, respectively, during write mode of operation or of logic low and high levels L and H, respectively, during read mode of operation. The first and second transistor $Q_1$ and $Q_2$ have their respective source and drain jointly connected to an output terminal $CG1_{OUT}$ leading to each of the memory array blocks $M_1, M_2, \ldots, M_l$ of the memory array 10 shown in FIG. 1 of the drawings. In the description to follow, each of these first and second transistor $Q_1$ and $Q_2$ has a threshold voltage equal to the threshold voltage $V_T$ mentioned in connection with the arrangement of FIGS. 1 to 3.

During erase mode of operation, there is the voltage $V_{PP}$ built up at the gate of the first transistor $Q_1$, which is therefore made conductive. With the write-erase voltage $V_{PP}$ established at the voltage supply terminal "P", there appears a voltage $V_{PP}-V_T$ at the output terminal $CG1_{OUT}$ of the gate control circuit 16. The second transistor $Q_2$ is held in a non-conduction state with a voltage of logic low level "L" established at the output terminal of the logic circuit 30. To the memory transistor $Q_M$ of the selected memory cell $M_{11}$ (FIGS. 2 and 3) is thus supplied the voltage $V_{PP}-V_T$ as the control gate voltage $V_{CG1}$.

During write or read mode of operation, on the other hand, there is a voltage of logic low level "L" at the gate of the first transistor $Q_1$, which is therefore held in a non-conduction state. With a voltage of logic high level "H" appearing at the output terminal of the logic circuit 30, the drain of the second transistor $Q_2$ is connected to the ground line through the source of the transistor $Q_2$ with the result that a voltage of ground level $V_{GRD}$ appears at the output terminal $CG1_{OUT}$ of the gate control circuit 16. To the memory transistor $Q_M$ of the selected memory cell $M_{11}$ (FIGS. 2 and 3) is thus applied the voltage of the ground level $V_{GRD}$ as the control gate voltage $V_{CG1}$ not only during write mode of operation but also during read mode of operation as indicated in Tables 1 and 2. This means that the readout voltage $V_{R1}$ to be used for read mode of operation is given as the control gate voltage $V_{CG1}$ of the ground level $V_{GRD}$ and thus satisfies all of the requirements (a), (b) and (c) hereinbefore enumerated.

There however arises a problem from the use of the control gate voltage $V_{CG1}$ of the ground level $V_{GRD}$ as the readout voltage $V_{R1}$. The control gate voltage $V_{CG1}$ of the ground level results in significant reduction in the current to flow through the memory transistor $Q_M$ having a logic "1" bit of data stored therein. A reduced current through such a memory transistor $Q_M$ might disable the sense amplifier 24 (FIG. 3) from operating fast and properly when the memory transistor $Q_M$ is selected for being read out, as will be discussed in more detail as the description proceeds. Prior to entering into detailed discussion such a problem, some important aspects of a memory system using stacked-gate transistors in memory cells as in a system of the nature under consideration will be reviewed.

(a) An integrated circuit chip including memory transistors such as the memory transistors $Q_M$ is ordinarily fabricated using cell channel doping techniques to implant dopant ions selectively into those regions of the chip which are to form the channel regions of the memory transistors. Such a cell channel doping process is required to achieve the original threshold voltage $V_{TM}(0)$ of a desired level for each of the memory transistors independently of the other FET devices to form the memory array in the chip. In the case of the memory system using the gate control circuit 16 shown in FIG. 5, the cell channel doping for the memory transistors is performed to produce a voltage of zero volts as the original threshold voltage $V_{TM}(0)$.

(b) In order that a logic "1" bit of data may not be erroneously written into any of the memory transistors during read mode of operation of the memory system, the sense amplifier in the input/output buffer unit for each of the memory array blocks is designed so that a sufficiently low voltage of, for example, 1 volt will be applied to the drain of each of the memory transistors during read mode of operation of the system. For this reason, the memory transistors of the system operate with such performance characteristics that are tantamount to those of a triode during read mode of operation.

(c) The floating gate of a memory transistor having a control gate in addition to the floating gate is relatively small with respect to the control gate.

Now, the current, $I_{ON}$, which flows through a memory transistor into which a logic "1" bit of data is memorized is given by $$I_{ON}=(W/L)\mu_e C_{OX}[(V_R-V_{TM}(W))V_D-V_D^2/2],\quad (1)$$

where W/L is the ratio between the width W and length L of the floating gate region of the memory transistor, $\mu_e$ is the mobility of electrons, $C_{OX}$ is the relative capacitance of the floating gate with respect to the control gate of the transistor, $V_R$ is the readout voltage to be used for the transistor, and $V_D$ is the voltage applied to the drain of the transistor. When the write-erase voltage $V_{PP}$ of, for example, 21 volts is used and if it is desired that the threshold voltage $V_{TM}(W)$ of a memory transistor having a logic "1" bit of data stored therein be selected to provide the initial $V_{TM}(W_1)$ of −4 volts as previously noted, the current $I_{ON}$ through such a memory transistor is as low as tens of microamperes. If, as a matter of fact, the ratio W/L is selected at 1.5, the electron mobility $u_e$ selected at 440 cm²/volt.-sec, and the relative capacitance $C_{OX}$ selected at 2×10⁴ pF/cm² by way of example, then the current $I_{ON}$ which flows through the memory transistor under consideration is given as 46.2 microamperes when the readout voltage $V_{R1}$ of zero volts is used for the memory transistor. The use of the readout voltage $V_{R1}$ of zero volts as in the conventional gate control circuit 16 arranged as described with reference to FIG. 5 thus results in the current $I_{ON}$ of a small magnitude as will be apparent from equation (1). The current which flows through the memory transistor having the logic "1" bit of data stored therein is, in actuality, still less than the value $I_{ON}$ given by equation (1). This is for the following two reasons:

(a) The dopant density of those channel regions of the memory transistors which have been selectively doped by the cell channel doping process as previously noted tends to vary from one memory transistor to another. If the original threshold voltage $V_{TM}(0)$ of one memory transistor thus happens to deviate toward the positive from the desired proper value, the initial-stage threshold voltage $V_{TM}(W_1)$ to which the original threshold voltage $V_{TM}(0)$ is shifted with a logic "1" bit of data written into the transistor also deviates toward the positive from the desired proper value of the memory transistor. Such upward deviation of the threshold voltage $V_{TM}(W)$ of the memory transistor $Q_M$ storing the logic "1" bit of data results in reduction in the value of the term $V_{TM}(R)-V_{TM}(W_1)$ in equation (1) and accordingly in the current $I_{ON}$ which is actually achievable at the drain of the particular memory transistor.

(b) When the memory transistor storing the logic "1" bit of data is selected during read mode of operation after the transistor has repeated the standardized limitative number $N_{(LIM)}$ of write-erase cycles, the memory transistor has a threshold voltage $V_{TM}(W_2)$ which has further shifted toward the positive from the initial-stage level $V_{TM}(W_1)$ as previously noted. The threshold voltage $V_{RM}(W_2)$ is thus lower in magnitude than the initial-stage threshold voltage $V_{TM}(W_1)$ and further gives rise to a decrease in the value of the term $V_{TM}(R)-V_{TM}(W_1)$ in equation (1) and accordingly a decrease in the current $I_{ON}$ which is actually achievable in the memory transistor $Q_M$. This effect is herein referred to as the degradation of the performance quality of the memory transistor.

Curve $T_{W1'}$ in FIG. 4 shows the variation in the threshold voltage $V_{TM}(W)$ of a memory transistor storing a logic "1" bit of data and having an upwardly deviated original threshold voltage $V_{TM}(W_3)$. The upward deviation of the original threshold voltage has resulted from the irregularity in the dopant density of the channel regions of memory transistors fabricated using the cell channel doping techniques as discussed above. Represented by $V_{TM}(W_3)$ is the initial-stage threshold voltage which the memory transistor $Q_M$ will exhibit at a certain initial stage of use after fabrication. When the memory transistor has such an upwardly deviated initial-stage threshold voltage $V_{TM}(W_3)$, the term $V_R-V_{TM}(W)$ in equation (1) becomes $V_{R1}-V_{TM}(W_3)$ or simply $-V_{TM}(W_3)$ and is significantly less than $-V_{TM}(W_3)$ or $V_{R1}-V_{TM}(W_3)$. If the threshold value $V_{TM}(W_3)$ is −3.5 volts by way of example, then the value of the term $V_R-V_{TM}(W)$ in equation (1) becomes −3.5 volts.

It is now assumed for purposes of consideration that the minimum current $I_{ON}$ which a sense amplifier is capable of detecting at the drain of the memory transistor of the type under consideration is 20 microamperes. If the memory transistor has a logic "1" bit of data stored therein and is selected during read mode of operation after the transistor has repeated the standardized limitative number $N_{(LIM)}$ of write-erase cycles, the threshold voltage of the memory transistor $Q_M$ must be such that will satisfy the following relationship in order to enable the sense amplifier to properly respond to the current $I_{ON}$ through the memory transistor:

$$|V_{TM}(W_1)-V_{TM}(W_2)|\geq 2 \text{ volts.}\quad (2)$$

If the memory transistor having the logic "1" bit of data stored therein and selected during read mode operation after the transistor has repeated the standardized limitative number $N_{(LIM)}$ of write-erase cycles happens to have improper device characteristics, the sense amplifier associated with such a memory transistor would be unable to properly respond to the small current $I_{ON}$ through the memory transistor $Q_M$. The operation time required for the sense amplifier shares considerably in the total operation time of an EEPROM system and, for this reason, it is important to enable the sense amplifier to operate faster for enabling the system to operate at a higher speed. A sense amplifier to be used in conjunction with the prior-art gate control circuit herein shown and described is ordinarily constructed by a circuit designed to be responsive to a minute change in the voltage on the bit lines to which a large capacitance of the order of picofarads is to be afforded. As well known in the art, the speed of operation, herein denoted by $t_{SENSE}$, of a sense amplifier is given as $$t_{SENSE}=(C_{COL}/I_{ON})\Delta V,\quad (3)$$

where $C_{COL}$ is the capacitance afforded to a bit line and $\Delta V$ is the differential voltage which the sense amplifier is capable of detecting on a bit line when a memory transistor having a logic "1" bit of data stored therein is selected during read mode of operation after the transistor has repeated the standardized limitative number $N_{(LIM)}$ of write-erase cycles. It will be readily seen from this equation (3) that, in order to enable the sense amplifier to operate at a higher speed, it is required that the current $I_{ON}$ to flow through the memory transistor storing the logic "1" bit of data be increased. The described prior-art gate control circuit using the readout voltage $V_{R1}$ of the ground level $V_{GRD}$ is unacceptable from this point of view since such a readout voltage inevitably results in a small value of the term $V_R - V_{TM}(M)$ in equation (1) which in turn results in a small value of the current $I_{ON}$.

As will have been understood from the foregoing analysis, the prior-art gate control circuit of the nature herein shown and described in advantageous for its relatively simple construction but is unacceptable particularly in that it is designed to produce an output voltage of the ground level $V_{GRD}$ as the control gate voltage $V_{CG1}$ during read mode of operation. The readout voltage $V_{R1}$ of the ground level $V_{GRD}$ used as the control gate voltage $V_{CG1}$ results in a small differential value between the readout voltage $V_{R1}$ and the threshold voltage $V_{TM}(W)$ of a memory transistor having a logic "1" bit of data stored therein and, accordingly, gives rise to a decrease in the current $I_{ON}$ to flow through the particular memory transistor during read mode of operation. Thus, the prior-art gate control circuit of the described nature has drawbacks in that (1) the gate control circuit is not compatible in performance with an EEPROM system which is required to operate at high speed, and that (2) the circuit has not such a margin that is broad enough to compensate for the degradation of the performance quality of the memory transistor as caused by the repeated write-erase cycles.

Another drawback of the described prior-art gate control circuit results from the necessity of using the cell channel doping process for the fabrication of the EEPROM system to be controlled by the gate control circuit. As previously discussed, the dopant density of the channel regions of the memory transistors selectively doped by the cell channel doping process tends to vary from one memory transistor to another. If the original threshold voltage $V_{TM}(0)$ of one memory transistor thus happens to deviate toward the positive from the desired proper value, the initial-stage threshold voltage $V_{TM}(W_1)$ to which the original threshold voltage $V_{TM}(0)$ of the transistor is shifted with a logic "1" bit of data stored therein also deviates upwardly to the level of the threshold voltage $V_{TM}(W_3)$ indicated by curve $T_{W1}'$ in FIG. 4. Such upward deviation of the initial-stage threshold voltage $V_{TM}(W_1)$ of the memory transistor storing the logic "1" bit of data also results in reduction in the value $V_{TM}(R) - V_{TM}(W_1)$ and accordingly in the current $I_{ON}$ through the memory transistor and may thus cause the associated sense amplifier to operate erroneously or improperly during read mode of operation.

The present invention contemplates provision of an improved gate control circuit which will overcome these problems of a prior-art gate control circuit of the described nature.

DESCRIPTION OF THE PREFERRED EMBODIMENT

Figure 6:
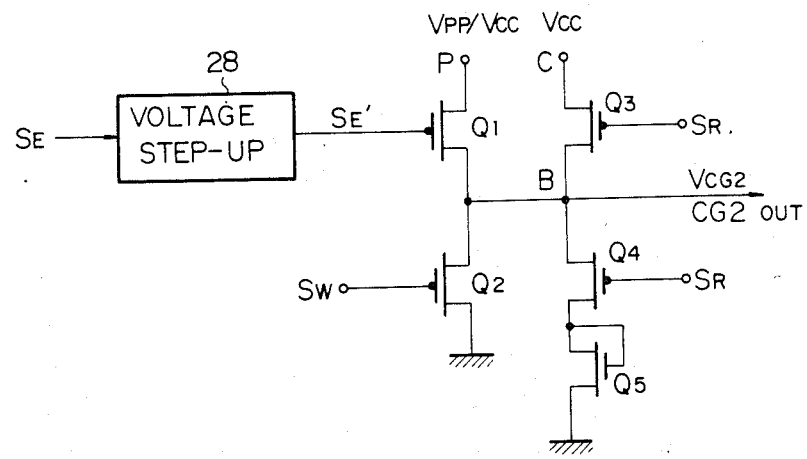
FIG. 6 is a circuit diagram similar to FIG. 5 but shows the circuit arrangement of a gate control circuit which forms part of a preferred embodiment of a semiconductor memory system according to the present invention.

FIG. 6 of the drawings is a circuit diagram showing the circuit arrangement of a gate control circuit of a preferred embodiment of a semiconductor memory system according to the present invention. The gate control circuit herein shown is assumed, by way of example, to form part of an EEPROM type semiconductor memory system of the nature which has been described with reference to FIGS. 1 to 3 but may be applied to any modification of such a semiconductor memory system.

Referring to FIG. 6, the gate control circuit, now represented by reference numeral 32, comprises a series combination of first and second transistors $Q_1$ and $Q_2$ each of which is assumed to be of the enhancement-mode n-channel type. The first transistor $Q_1$ has its drain connected to a voltage supply terminal "P". This voltage supply terminal "P" is similar to its counterpart in the arrangement of FIG. 5 and there are thus selectively established a predetermined write-erase voltage $V_{PP}$ during write and erase modes of operation and a constant supply voltage $V_{CC}$ during read mode of operation. As previously noted, the write-erase voltage $V_{PP}$ is higher than the supply voltage $V_{CC}$.

The transistor $Q_1$ has its gate connected to a voltage step-up circuit 28 having an input terminal connected to be responsive to the control signal $S_E$ of logic high level "H" to be output from the mode control signal generator 20 (FIG. 3) during erase mode of operation. In response to the signal $S_E$ of logic high level "H", the voltage step-up circuit 28 produces an erase control signal $S_E'$ of a certain relatively high voltage at the gate of the transistor $Q_1$. This high voltage of the erase control signal $S_E'$ to be output from the voltage step-up circuit 28 is herein assumed to be equal to the write-erase voltage $V_{PP}$ by way of example. During write or read mode of operation, on the other hand, there is a signal of logic low level "L" established at the gate of the transistor $Q_1$. The voltage step-up circuit 28 provides in combination with the control signal generator 20 (FIG. 2) control signal generating means in the gate control circuit 32 of the system embodying the present invention.

Furthermore, the second transistor $Q_2$ has its source connected to ground line and its gate connected to be responsive to the control signal $S_W$ to be output from the mode control signal generator 20 (FIG. 3). As shown in Table 1, this control signal $S_W$ assumes a logic high level "H" during write mode of operation and a logic low level "L" during erase or read mode of operation. The first and second transistor $Q_1$ and $Q_2$ have their respective source and drain jointly connected to an output terminal $CG2_{OUT}$ leading to each of the memory array blocks $M_1, M_2, \ldots M_I$ of the memory array 10 shown in FIG. 1.

The gate control circuit 32 of the semiconductor memory system embodying the present invention further comprises another series combination of third and fourth transistors $Q_3$ and $Q_4$. The third transistor $Q_3$ has its drain connected to a supply voltage terminal "C" at which is established the supply voltage $V_{CC}$, and the fourth transistor $Q_4$ has its drain connected to a node "B" as shown. Each of the third and fourth transistors $Q_3$ and $Q_4$ has its gate connected to be responsive to the control signal $S_R$ to be output from the mode control signal generator 20 (FIG. 3). As shown in Table 1, this control signal $S_R$ assumes a logic high level "H" during read mode of operation and a logic low level "L" during write or erase mode of operation. The third and fourth transistor $Q_3$ and $Q_4$ have their respective source and drain also jointly connected to the output terminal $CG2_{OUT}$. The gate control circuit 32 shown in FIG. 6 further comprises a fifth transistor $Q_5$ which has its source connected to ground and both of its gate and drain connected to the node "B" leading to the source of the fourth transistor $Q_4$. Each of these third and fourth transistors $Q_3$ and $Q_4$ is also assumed to be of the enhancement-mode n-channel type. It is herein further assumed that each of the first to fourth transistors $Q_1$ to $Q_4$ has a threshold voltage equal to the threshold voltage $V_T$ mentioned in connection with the arrangement of FIGS. 1 to 3, while the fifth transistor $Q_5$ assumed to have a threshold voltage $V_{T5}$ which is equal to or which approximates the threshold voltage $V_T$. In the embodiment herein shown, this threshold voltage $V_{T5}$ of the fifth transistor $Q_5$ is assumed to be selected to be equal to the threshold voltage $V_T$ of each of the first to fourth transistors $Q_1$ to $Q_4$. As noted previously, the threshold voltage $V_T$ of these transistors $Q_1$ to $Q_5$ may be of a value typical of a standard enhancement-type n-channel transistor.

Table 3 below shows the schedules in accordance with which the control signal of logic low level "L" or logic high level "H" is to appear at the gate of each of the first to fourth transistors $Q_1$ to $Q_4$ during each of write, erase and read modes of operation. In Table 3 is also shown the control gate voltage $V_{CG2}$ which is to appear at the output terminal $CG2_{OUT}$ of the gate control circuit 32 shown in FIG. 6 during each of write, erase and read modes of operation.

TABLE 3

| Mode of Operation | $Q_1$ | $Q_2$ | $Q_3$ | $Q_4$ | $V_{CG2}$ |
|---|---|---|---|---|---|
| Write | L | H | L | L | $(V_{PP}-V_T)$ |
| Erase | H | L | L | L | $V_{GRD}$ |
| Read | L | L | H | H | $V_{T5}$ $(=V_T)$ |

Description will be hereinafter made with reference to FIG. 6 and back to FIGS. 1 to 3 regarding the operation of the gate control circuit 32 of FIG. 6 during each of write, erase and read modes of operation.

During erase mode of operation, there is the voltage $V_{PP}$ built up as the erase control signal $S_E'$ at the gate of the first transistor $Q_1$, which is therefore made conductive. With the write-erase voltage $V_{PP}$ also appearing at the voltage supply terminal "P", there appears a voltage $V_{PP}-V_T$ at the output terminal $CG2_{OUT}$ of the gate control circuit 32. Each of the second, third and fourth transistors $Q_2$, $Q_3$ and $Q_4$ is held in a non-conduction state with a voltage of logic low level "L" established at the gate thereof. To the memory transistor $Q_M$ of the selected memory cell $M_{11}$ (FIGS. 2 and 3) is thus supplied the voltage $V_{PP}-V_T$ as the control gate voltage $V_{CG2}$.

During write mode of operation, there is a voltage of logic low level "L" at the gate of the first transistor $Q_1$, which is therefore held in a non-conduction state. With a voltage of logic high level "H" appearing at the gate of the second transistor $Q_2$, the drain of the transistor $Q_2$ is connected through the source of the transistor $Q_2$ with the result that a voltage of ground level $V_{GRD}$ appears at the output terminal $CG2_{OUT}$ of the gate control circuit 32. To the memory transistor $Q_M$ of the selected memory cell $M_{11}$ (FIGS. 2 and 3) is thus supplied the voltage of the ground level $V_{GRD}$ as the control gate voltage $V_{CG2}$. During write mode of operation, each of the third and fourth transistors $Q_3$ and $Q_4$ is held in a non-conduction state with a voltage of logic low level "L" established at the gate thereof.

During read mode of operation, each of the first and second transistors $Q_1$ and $Q_2$ is held in a non-conduction state in response to a voltage of logic low level "L" applied to the gate of transistor. With a voltage of logic high level "H" appearing at the gate of each of the third and fourth transistors $Q_3$ and $Q_4$, both the transistor $Q_3$ and the transistor $Q_4$ are turned on. Under these conditions, a voltage equal to the threshold voltage $V_{T5}$ of the fifth transistor $Q_5$ appears at the output terminal $CG2_{OUT}$ of the gate control circuit 32 and is supplied to the memory transistor $Q_M$ of the selected memory cell $M_{11}$ (FIGS. 2 and 3).

The fifth transistor $Q_5$ is designed so that the ratio between the width and length of the gate region of the transistor $Q_5$ is sufficiently larger than that of each of the third and fourth transistors $Q_3$ and $Q_4$. The threshold voltage $V_{T5}$ $(=V_T)$ of the fifth transistor $Q_5$ is for this reason maintained constant without respect to any change in the supply voltage $V_{CC}$ applied to the drain of the third transistors $Q_3$. In this fashion, the control gate voltage $V_{CG2}$ to be used as the readout voltage, now denoted by $V_{R2}$, is assuredly given as threshold voltage $V_{T5}$ $(=V_T)$ of the fifth transistor $Q_5$ during read mode of operation.

Figure 7:
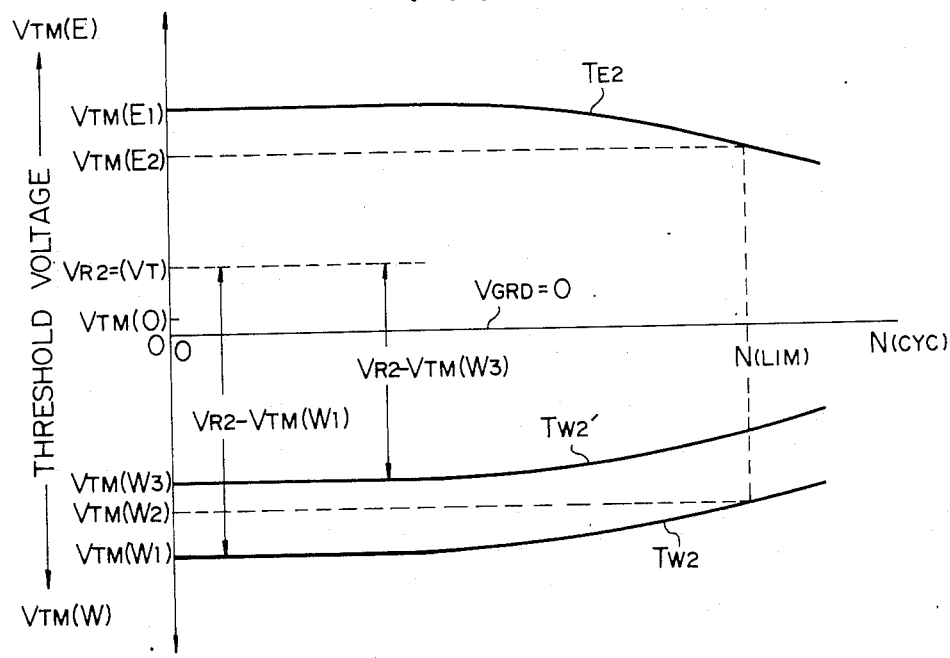
FIG. 7 is a graphic representation of the variation in the threshold voltages of a memory transistor included in a semiconductor memory system incorporating the gate control circuit illustrated in FIG. 6 in accordance with the present invention.

The memory transistors $Q_M$ of the memory array to be controlled by the gate control circuit 32 proposed by the present invention are also fabricated using the cell channel doping techniques so that the original threshold voltage $V_{TM}(0)$ of each of the memory transistors $Q_M$ equals zero volts as in the case of the memory array controlled by the prior-art gate control circuit 16 shown in FIG. 5. FIG. 7 is similar to FIG. 4 and is a graphic representation of the variation in the threshold voltages of such a memory transistor $Q_M$. In FIG. 7, curve $T_{W2}$ also shows the variation in the threshold voltage $V_{TM}(W)$ of a memory transistor $Q_M$ having a logic "1" bit of data stored therein and curve $T_{E1}$ shows the variation in the threshold voltage $V_{TM}(E)$ of a memory transistor $Q_M$ having a logic "0" bit of data stored therein, both in terms of the number N of write-erase cycles which the memory transistor $Q_M$ has repeated. The values represented by $V_{TM}(W_1)$, $V_{TM}(W_2)$, $V_{TM}(E_1)$ and $V_{TM}(E_2)$ in FIG. 7 are indicative of the threshold voltages similar to their respective counterparts indicated in FIG. 4. Thus, the threshold voltages $V_{TM}(W_1)$ and $V_{TM}(E_1)$ are respectively the initial-stage threshold voltages of the memory transistors $Q_M$ respectively having logic "1" and "0" bits of data stored therein, while the threshold voltages $V_{TM}(W_2)$ and $V_{TM}(E_2)$ are the reduced threshold voltages which the memory transistors $Q_M$ respectively having logic "1" and "0" bits of data stored therein exhibit during read mode of operation after each of the transistors has repeated the standardized limitative number $N_{(LIM)}$ of write-erase cycles. Curve $T_{W2}'$ shows the variation in the threshold voltage $V_{TM}(W)$ of a memory transistor storing a logic "1" bit of data and having an upwardly deviated original threshold voltage. Represented by $V_{TM}(W_3)$ is the upwardly deviated initial-stage threshold voltage of the memory transistor resulting from the irregularity of cell channel doping during fabrication of the memory transistors as discussed above.

As has been noted, the readout voltage $V_{R2}$ produced as the control gate voltage $V_{CG2}$ during read mode of operation in the embodiment of the present invention is equal to the threshold voltage $V_T$ of the fifth transistor $Q_5$ in the gate control circuit 32 described with reference to FIG. 6. As will be seen from FIG. 7, such a readout voltage $V_{R2}$ is higher than the reduced threshold voltage $V_{TM}(W_2)$ of a memory transistor $Q_M$ storing a logic "1" bit of data and lower than the reduced threshold voltage $V_{TM}(E_2)$ of a memory transistor $Q_M$ storing a logic "0" bit of data and, thus, meet the previously mentioned requirements (a) and (b) for the readout voltage. In addition, such a readout voltage $V_{R2}$ could be of a value which will also meet the requirement (c) through proper selection of the threshold voltage $V_T$.

Furthermore, the value of the term $V_R - V_{TM}(W)$ in equation (1) is in this instance given as $V_T - V_{TM}(W_1)$, $V_T - V_{TM}(W_2)$ or $V_T - V_{TM}(W_3)$ which is significantly larger than $V_{R1} - V_{TM}(W_1)$, $V_{R1} - V_{TM}(W_2)$ or $V_{R1} - V_{TM}(W_3)$, respectively, in the case of the memory system using the gate control circuit 16 of FIG. 5, as will be apparent from comparison between FIGS. 4 and 7. The larger value of $V_T - V_{TM}(W)$ thus available in the system embodying the present invention results in the larger current $I_{ON}$ to flow through the memory transistor $Q_M$ storing a logic "1" bit of data and will enable the associated sense amplifier to operate the faster and the more reliably in response to the control gate voltage $V_{CG2}$ from the gate control circuit 32.

For better understanding of such an effect achievable in the present invention, it is now assumed that the write-erase voltage $V_{PP}$ of 21 volts is used and that the threshold voltage $V_{TM}(W)$ of a memory transistor having a logic "1" bit of data stored therein is selected to provide the initial-stage $V_{TM}(W_1)$ of $-4$ volts as previously noted. It is further assumed that the memory transistor $Q_M$ has the initial-stage threshold voltage $V_{TM}(W_1)$ of $-4$ volts as in the case of the system using the prior-art gate control circuit and that the value of the threshold voltage $V_T$ of a standard enhancement-type n-channel transistor is 1.0 volt. In consideration of the fact that the readout voltage $V_{R2}$ used in the system embodying the present invention is assumed to be equal to the threshold voltage $V_T$, the current $I_{ON}$ to flow through the memory transistor $Q_M$ storing a logic "1" bit of data becomes 59.4 microamperes from equation (1) and is higher about 28.6 percent than the current of 46.2 microamperes achievable in the prior-art system, provided other conditions are similar to those exemplified for the prior-art system. The use of the readout voltage $V_{R2}$ equal to the threshold voltage $V_T$ as in the memory system embodying the present invention thus results in a considerable increase in the current $I_{ON}$ which flows through the memory transistor having a logic "1" bit of data stored therein and will accordingly enable the associated sense amplifier to operate the faster.

Assume, furthermore, that a memory transistor $Q_M$ storing a logic "1" bit of data has an initial-stage threshold voltage which has shifted to the level $V_{TM}(W_3)$ due to the irregularity in cell channel doping for the memory transistor $Q_M$. If, in this instance, the initial-stage threshold voltage $V_{TM}(W_3)$ of the memory transistor $Q_M$ is $-3.5$ volts by way of example, then the value of the term $V_R - V_{TM}(W)$ in equation (1) becomes $-4.5$ volts. Assume, furthermore, that the minimum current $I_{ON}$ which a sense amplifier is capable of detecting at the drain of the memory transistor is 20 microamperes as previously noted and that the memory transistor thus storing the logic "1" bit of data and having the initial-stage threshold voltage $V_{TM}(W_3) -3.5$ is selected during read mode of operation after the transistor has repeated the standardized limitative number $N_{(LIM)}$ of write-erase cycles. In order that the sense amplifier associated with such a memory transistor be enabled to properly respond to the current $I_{ON}$ through the memory transistor, the previously mentioned reduced threshold voltage $V_{TM}(W_2)$ of the memory transistor must be such that will satisfy the following relationship:

$$|V_{TM}(W_1) - V_{TM}(W_2)| \geq 3 \text{ volts.} \quad (4)$$

Comparison of this relationship with the relationship (3) previously presented will clearly show that a memory transistor $Q_M$ used in the memory system embodying the present invention has a broader margin to compensate for the degradation of the performance quality of the transistor as caused by the repeated write-erase cycles and thus enables the associated sense amplifier to operate properly and reliably.

The use of the threshold voltage $V_T$ of an ordinary n-channel IG FET device as the readout voltage $V_{R2}$ in the memory system embodying the present invention is of further advantage where the original threshold voltage $V_{TM}(0)$ of the memory transistors $Q_M$ is selected also at the value $V_T$. In this instance, the channel doping process which may be used for the fabrication of the memory system under consideration can be performed unselectively for both the memory transistors $Q_M$ and all the other transistors included on the chip and having basic design characteristics similar to those of the memory transistors $Q_M$. This not only provides ease of the channel doping process but will alleviate the seriousness which may be invited by the irregularities of channel doping. If the original threshold voltage $V_{TM}(0)$ of one memory transistor $Q_M$ differs from that of another due to the difference in the dopant density between the channel regions of the transistors, there will be similar irregularities in the threshold voltage $V_T$ among the other transistors associated with such memory transistors $Q_M$. This means that there will not be a significant amount of deviation between the currents $I_{ON}$ which are to flow respectively through memory transistors $Q_M$ each storing a logic "1" bit of data.

Figure 8:
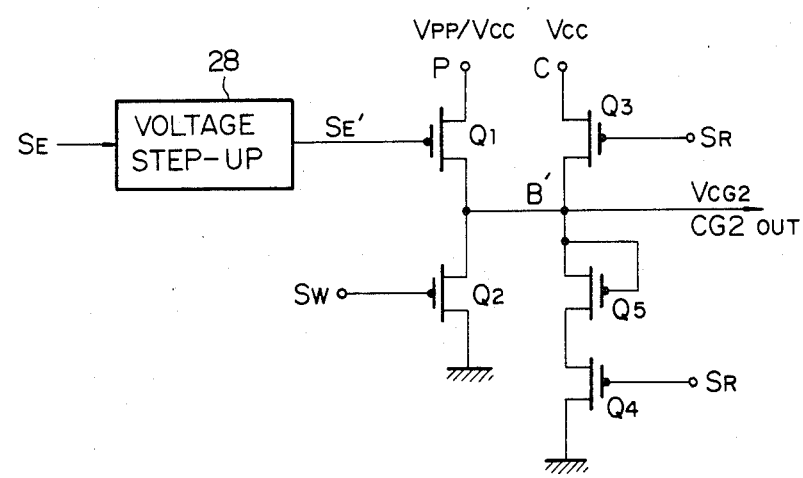
FIG. 8 is a circuit diagram similar to FIG. 6 but shows the circuit arrangement of a modification of the gate control circuit illustrated in FIG. 6.

While only one preferred embodiment of a semiconductor memory system according to the present invention has hereinbefore been described and shown, it should be borne in mind that such an embodiment is merely for the purpose of description and is for this reason subject to modification and change if desired. In the gate control circuit illustrated in FIG. 6, for example, the third transistor $Q_3$ which has been assumed to be of the n-channel type may in particular be replaced with a p-channel IG FET device. In this instance, the mode control signal to be applied to the gate of each of the p-channel IG FET devices should be an inverted version ($S_R^-$) of the signal $S_R$ originating in the control signal generator 20 (FIG. 2). Furthermore, results essentially similar to those achievable with the arrangement of the fourth and fifth transistors $Q_4$ and $Q_5$ of the gate control circuit 32 as shown in FIG. 6 will be achieved when such arrangement is modified in such a manner that the two transistors $Q_4$ and $Q_5$ are exchanged with each other. In this instance, the fifth transistor $Q_5$ has its gate and drain jointly connected to the output terminal $CG2_{OUT}$ and its source connected to a node B' leading to the drain of the fourth transistor $Q_4$, which has its source connected to ground line and its gate connected to be responsive to the control signal $S_R$ as shown in FIG. 8.

As will have been understood from the foregoing description, a semiconductor memory system according to the present invention largely comprises a memory cell including a memory transistor $Q_M$, a control circuit 32 for the memory transistor $Q_M$, and readout means constituted by the sense amplifier 24. The memory transistor $Q_M$ has a first threshold voltage ($V_{TM}(E)$) higher than a predetermined reference level ($V_{GRD}$) when the memory transistor is in a state storing one of a logic "1" bit of data and a logic "0" bit of data and a second threshold voltage ($V_{TM}(W)$) lower than the reference level when the memory transistor is in a state storing the other of said logic "1" bit of data and said logic "0" bit of data. The readout voltage generating means of the control circuit 32 is constituted by the transistors $Q_3$, $Q_4$ and $Q_5$ which are arranged to be operative to produce a readout voltage ($V_{R2}=V_T$) intervening between the reference level and the first threshold voltage. The memory transistor $Q_M$ is responsive to the readout voltage for having a first state if the transistor has the first threshold voltage and a second state if the transistor has the second threshold voltage. The readout means constituted by the sense amplifier 24 is responsive to each of the first and second states of the memory transistor $Q_M$ for reading the logic "1" bit of data or the logic "0" bit of data stored therein.

In the semiconductor memory system thus constructed and arranged, the readout voltage $V_{R2}$ is equal to the threshold voltage $V_T$ of an ordinary IG FET device so that there is an increased differential voltage produced between the readout voltage $V_R$ and the second threshold voltage $V_{TM}(W)$ of the memory transistor $Q_M$ storing, for example, a logic "1" bit of data during read mode of operation. Such an increased diffential voltage between the readout voltage $V_R$ and the second threshold voltage $V_{TM}(W)$ results in an increased current $I_{ON}$ to flow through the memory transistor $Q_M$ storing the logic "1" bit of data and enables the readout means, viz., the sense amplifier 24 associated with the memory transistor $Q_M$ is enabled to operate faster and more reliably than in an EEPROM type memory system using a conventional gate control circuit. A semiconductor memory system according to the present invention further features the gate control circuit which provides a margin broad enough to compensate for the degradation of the performance quality of the memory transistor as caused when the transistor has repeated a number of write-erase cycles.

Where the original threshold voltage $V_{TM}(0)$ of the memory transistors $Q_M$ is selected also at the value $V_T$, furthermore, the channel doping process to be performed for the fabrication of the memory transistors $Q_M$ can be used also for the fabrication of all the other transistors included on the chip. This not only provides ease of the channel doping process but will alleviate the seriousness which may be invited by the irregularities of channel doping so that there will not be a significant amount of deviation between the currents $I_{ON}$ which are to flow respectively through memory transistors $Q_M$ each storing a logic "1" bit of data.

What is claimed is:

1. A semiconductor memory system comprising;
    (a) a memory cell including a floating gate memory transistor, said transistor having a first threshold voltage higher than a ground level when said transistor is in a state storing one of a logic "1" and a logic "0", and a second threshold voltage lower than said ground level when said transistor is in a state storing the other of said logic "1" and said logic "0";
    (b) a control circuit comprising readout voltage generating means operative to produce a readout voltage intervening between said ground level and said first threshold voltage, said memory transistor being responsive to said readout voltage to achieve a first, conductive state if said transistor then has said first threshold voltage and a second, non-conductive state if said transistor then has said second threshold voltage, and
    (c) readout means responsive to each of said first state and said second state of said transistor, for reading the logic "1" or the logic "0" stored therein.

2. A semiconductor memory system as set forth in claim 1, in which said control circuit further comprises write voltage generating means operative to produce a write voltage of a predetermined level for producing one of said first state and said second state in said transistor to store said logic "1" in said transistor, and erase voltage generating means operative to produce an erase voltage of another predetermined level for producing the other of said first state and said second state in said transistor to store said logic "0" in said transistor.

3. A semiconductor memory system as set forth in claim 2, in which said transistor is of the non-volatile type and in which said control circuit has a circuit output terminal and is associated with a first voltage supply terminal receiving a constant supply voltage, a second voltage supply terminal receiving a predetermined write-erase voltage higher than said supply voltage, and control signal generating means operative to produce write, erase and readout control signals each having two logic states, and in which said erase voltage generating means and said write voltage generating means comprise first and second transistors, respectively, and said readout voltage generating means comprises third, fourth and fifth transistors, each of said first, second, third and fourth transistors having a control terminal and current input and output terminals, wherein said first transistor has its input terminal connected to said second voltage supply terminal, its control terminal arranged to be responsive to said erase control signal and its output terminal connected to said circuit output terminal, the first transistor being rendered conductive in response to the erase control signal of one of said logic states, said second transistor has its input terminal connected to said circuit output terminal and its control terminal arranged to be responsive to said write control signal, the second transistor being rendered conductive in response to the write control signal of one of said logic states, said third transistor has its input terminal connected to said first voltage supply terminal, its control terminal arranged to be responsive to said readout control signal and its output terminal connected to said circuit output terminal, the third transistor being rendered conductive in response to the readout control signal of one of said logic states, said fourth transistor has its control terminal arranged to be responsive to said readout control signal, the fourth transistor being rendered conductive in response to the readout control signal of one of said logic states, and said fifth transistor has its control terminal and input terminal coupled together, one of said fourth and fifth transistors having its input terminal connected to said circuit output terminal and its output terminal connected to the control terminal and input terminal of the other of said fourth and fifth transistors, the other of the fourth and fifth transistors being grounded.

4. A semiconductor memory system as set forth in claim 3, in which said fourth transistor has its input terminal connected to said circuit output terminal and said fifth transistor has its control terminal and input terminal jointly connected to the output terminal of said fourth transistor and has its output terminal grounded.

5. A semiconductor memory system as set forth in claim 3, in which said fifth transistor has its control terminal and input terminal jointly connected to said circuit output terminal and said fourth transistor has its input terminal connected to the output terminal of said fifth transistor and has its output terminal grounded.

6. A semiconductor memory system as set forth in claim 3, in which each of said first, second, third and fourth transistors consists of a field-effect transistor having its gate, drain and source provided by said control terminal, said input terminal and said output terminal, respectively.

7. A semiconductor memory system as set forth in claim 6, in which each of said first, second, third and fourth transistors consists of an n-channel field-effect transistor.

8. A semiconductor memory system as set forth in claim 7, in which each of said first, second and fourth transistors consists of an n-channel field-effect transistor and said third transistor consists of a p-channel field-effect transistor.

9. A semiconductor memory system including a non-volatile semiconductor memory element having a floating gate, comprising:
   (a) a voltage step-up circuit operative to produce a high voltage higher than a supply voltage during an erase mode of operation,
   (b) a first field-effect transistor having its drain connected to a first node at which is established a high voltage sufficient to erase information in said memory element during said erase mode of operation, and its gate connected to the output terminal of said voltage step-up circuit, said first field-effect transistor being in a conductive state during said erase mode of operation,
   (c) a second field-effect transistor connected to a source of said first field-effect transistor and controlled so as to be in a conductive state during a write mode of operation,
   (d) a third field-effect transistor having its drain connected to a supply voltage and its source connected to the source of said first field-effect transistor and the drain of said second field-effect transistor at a second node, said third field-effect transistor being in a conductive state during a readout mode of operation,
   (e) a fourth field-effect transistor controlled so as to be in a conductive state during a readout mode of operation,
   (f) a fifth field-effect transistor serially connected to said fourth field-effect transistor and having its gate and drain connected together, and
   (g) a circuit block connected between said second node and ground, said memory element being connected to said second node.

10. A semiconductor memory system comprising;
   (a) a memory cell including a memory transistor which has a first threshold voltage higher than a predetermined reference level when the memory transistor is in a state storing one of a logic "1" and a logic "0", and a second threshold voltage lower than said reference level when said memory transistor is in a state storing the other of said logic "1" and said logic "0",
   (b) a control circuit comprising readout voltage generating means operative to produce a readout voltage intervening between said reference level and said first threshold voltage, said memory transistor being responsive to said readout voltage to achieve a first state if the memory transistor then has said first threshold voltage and a second state if the memory transistor then has said second threshold voltage, and
   (c) readout means responsive to each of said first state and said second state of said memory transistor for reading the logic "1" or the logic "0" stored therein,
   (d) said control circuit further comprising write voltage generating means operative to produce a write voltage of a predetermined level for producing one of said first state and said second state in said memory transistor, to store said logic "1" in the memory transistor, and erase voltage generating means operative to produce an erase voltage of another predetermined level, to produce the other of said first state and said second state in said memory transistor, to store said logic "0" in the memory transistor,
   (e) which said memory transistor is of the nonvolatile type and wherein said gate control circuit has a circuit output terminal and is associated with a first voltage supply terminal receiving a constant supply voltage, a second voltage supply terminal for applying a predetermined write-erase voltage higher than said supply voltage, and control signal generating means operative to produce write, erase and readout control signals each having two logic states; and in which said erase voltage generating means and said write voltage generating means comprise first and second transistors, respectively, and said readout voltage generating means comprises third, fourth and fifth transistors, each of said first, second, third and fourth transistors having a control terminal and current input and output terminals,
   (f) said first transistor having its input terminal connected to said second voltage supply terminal, its control terminal arranged to be responsive to said erase control signal and its output terminal connected to said circuit output terminal, the first transistor being rendered conductive in response to the erase control signal of one of said logic states,
   (g) said second transistor having its input terminal connected to said circuit output terminal and its control terminal arranged to be responsive to said write control signal, the second transistor being rendered conductive in response to the write control signal of one of said logic states,
   (h) said third transistor having its input terminal connected to said first voltage supply terminal, its control terminal arranged to be responsive to said readout control signal and its output terminal connected to said circuit output terminal, the third transistor being rendered conductive in response to the readout control signal of one of said logic states,
   (i) said fourth transistor having its control terminal arranged to be responsive to said readout control signal, the fourth transistor being rendered conductive in response to the readout control signal of one of said logic states, and (j) said fifth transistor having its control terminal and input terminal coupled together, (k) one of said fourth and fifth tranistors having its input terminal connected to said circuit output terminal and its output terminal connected to the control terminal and input terminal of the other of said fourth and fifth transistors, the other of the fourth and fifth transistors being grounded.

11. A semiconductor memory system as set forth in claim 10, in which said fourth transistor has its input terminal connected to said circuit output terminal and said fifth transistor has its control terminal and input terminal jointly connected to the output terminal of said fourth transistor and has its output terminal grounded.

12. A semiconductive memory system as set forth in claim 10, in which said fifth transistor has its control terminal and input terminal jointly connected to said circuit output terminal and said fourth transistor has its input terminal connected to the output terminal of said fifth transistor and has its output terminal grounded.

13. A semiconductor memory system as set forth in claim 10, in which each of said first, second, third and fourth transistors consists of a field-effect transistor having its gate, drain and source provided by said control terminal, said input terminal and said output terminal, respectively.

* * * * *

UNITED STATES PATENT AND TRADEMARK OFFICE
CERTIFICATE OF CORRECTION

PATENT NO.   :   4,775,958
DATED        :   October 4, 1988
INVENTOR(S)  :   HASHIMOTO It is certified that error appears in the above-identified patent and that said Letters Patent is hereby corrected as shown below:

```
Col.  4, line 67, after "memory" insert --array--.
Col.  8, line 56, delete "voltge" insert --voltage--.
Col. 12, line 49, delete ">" insert --<--.
Col. 15, line 59, delete "V_{RM}(W_2)" insert --V_{TM}(W_2)--.
```

Signed and Sealed this

Ninth Day of May, 1989

Attest:

DONALD J. QUIGG

Attesting Officer

Commissioner of Patents and Trademarks